United States Patent
Feng et al.

(10) Patent No.: US 12,255,130 B2
(45) Date of Patent: Mar. 18, 2025

(54) AIRGAP STRUCTURES FOR HIGH SPEED SIGNAL INTEGRITY

(71) Applicant: INTEL CORPORATION, Santa Clara, CA (US)

(72) Inventors: Hongxia Feng, Chandler, AZ (US); Jeremy Ecton, Gilbert, AZ (US); Aleksandar Aleksov, Chandler, AZ (US); Haobo Chen, Chandler, AZ (US); Xiaoying Guo, Chandler, AZ (US); Brandon C. Marin, Gilbert, AZ (US); Zhiguo Qian, Chandler, AZ (US); Daryl Purcell, Chandler, AZ (US); Leonel Arana, Phoenix, AZ (US); Matthew Tingey, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 941 days.

(21) Appl. No.: 16/884,452

(22) Filed: May 27, 2020

(65) Prior Publication Data

US 2021/0375746 A1    Dec. 2, 2021

(51) Int. Cl.
    *H01L 23/522*      (2006.01)
    *H01L 23/66*      (2006.01)

(52) U.S. Cl.
    CPC .......... *H01L 23/5222* (2013.01); *H01L 23/66* (2013.01)

(58) Field of Classification Search
    CPC ........................... H01L 23/5222; H01L 23/66
    See application file for complete search history.

(56) References Cited

U.S. PATENT DOCUMENTS

| | | | | |
|---|---|---|---|---|
| 2002/0158337 A1* | 10/2002 | Babich | ................ | H01L 21/7681 257/750 |
| 2009/0302475 A1* | 12/2009 | Korogi | .............. | H01L 23/53238 257/E23.161 |
| 2012/0153463 A1* | 6/2012 | Maeda | .............. | H01L 23/49822 174/262 |
| 2015/0340322 A1* | 11/2015 | Mason | ................ | H01L 23/5329 438/783 |
| 2020/0153113 A1* | 5/2020 | Rogers | ............... | H01Q 21/0075 |

\* cited by examiner

*Primary Examiner* — Samuel A Gebremariam
(74) *Attorney, Agent, or Firm* — Essential Patents Group, LLP

(57) ABSTRACT

Processes and structures resulting therefrom for the improvement of high speed signaling integrity in electronic substrates of integrated circuit packages, which is achieved with the formation of airgap structures within dielectric material(s) between adjacent conductive routes that transmit/receive electrical signals, wherein the airgap structures decrease the capacitance and/or decrease the insertion losses in the dielectric material used to form the electronic substrates.

17 Claims, 13 Drawing Sheets

AIRGAP STRUCTURES FOR HIGH SPEED SIGNAL INTEGRITY

TECHNICAL FIELD

Embodiments of the present description generally relate to the field of integrated circuit package or assembly fabrication, and, more specifically, to the fabrication of electronic substrates used to route electrical signals for integrated circuit packages or assemblies.

BACKGROUND

The integrated circuit industry is continually striving to produce ever faster, smaller, and thinner integrated circuit devices and packages for use in various electronic products, including, but not limited to, computer servers and portable products, such as portable computers, electronic tablets, cellular phones, digital cameras, and the like.

As will be understood, faster integrated circuit devices and packages are facilitated with high speed signal transmission through conductive routes within electronic substrates to which the integrated circuit devices are electrically attached to form the integrated circuit packages. However, the integrity of high speed signaling generally suffers from two degradation mechanisms, cross-talk and insertion loss. Cross-talk, in the context of signaling, is a phenomenon wherein the signal being transmitted in one conductive route creates an undesired effect in at least one adjacent conductive route, such as capacitive, inductive, or conductive coupling, which degrades signal transmission. Capacitive coupling is one of the primary sources of near-end cross-talk of substrate routes. Insertion loss, in the context of signaling, is the loss of power as the signal travels through each conductive route due to material and structures within the electronic substrate. The main causes of insertion loss may include, but are not limited to, dielectric losses (loss caused by power dissipated in to dielectric material surrounding the conductive routes), conductor losses (loss caused by power dissipation due to conducting surfaces), and reflected losses (loss cased by voltage standing wave ratio (VSWR)). The dielectric loss of high speed signaling in electronic substrates is one of the primary insertion loss issues. As will be understood, the degradation mechanisms need to be addressed for high-speed signaling in the electronic substrates.

The capacitive cross-talk may be reduced by reducing the dielectric constant (Dk) of the dielectric material between the conductive routes. Lower Dk also leads to wider conductor design for the same impedance target, so it can improve the conductor loss. The dielectric loss may be reduced by reducing the dissipation factor "Df" or "tan δ" of the dielectric material (i.e. the measure that summarizes all dielectric losses contributing to the insertion loss) between the conductive routes. Although it is clear that a reduction of the dielectric constant Dk and the dissipation factor Df of a dielectric material is necessary to reduce cross-talk and insertion loss of substrate routes, the dielectric materials that are commonly used in the fabrication of electronic substrates, though having a dielectric constant Dk lower than silicon dioxide, generally have a comparably high dissipation factor Df. Furthermore, known dielectric materials having both a low dielectric constant Dk and a low dissipation factor Df, such as fluorinated polymers, are generally not suitable for fabricating electronic substrates due to their mechanical properties and/or interactions with other elements in the electronic substrate. Thus, significant effort is being focused on reducing the dielectric constant Dk to below 3.0 and the dissipation factor Df to below 0.004, and beyond, for future dielectric materials used in electronic substrates for integrated circuit packages.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
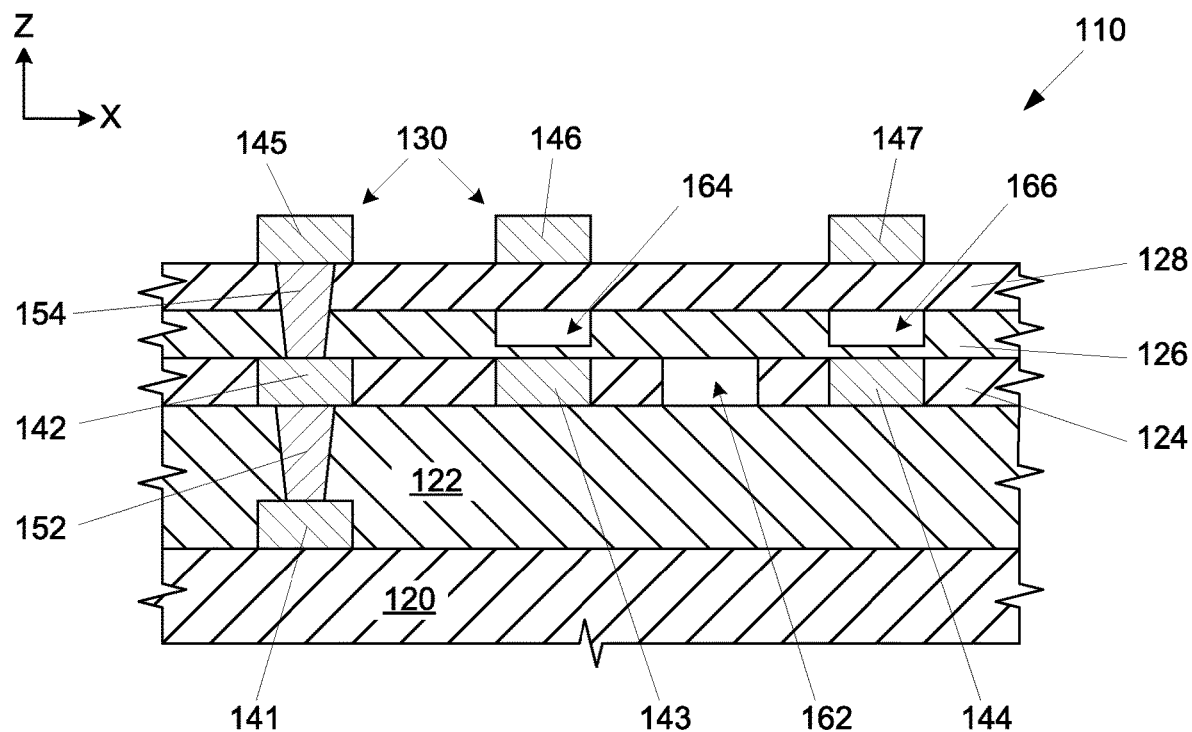
FIG. 1 is a side cross-sectional view of a portion of an electronic substrate, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description relate to processes and structures resulting therefrom that improve high speed signaling integrity in electronic substrates of integrated circuit packages. The high speed signaling integrity is improved through a decrease in the capacitance of the dielectric material and/or a decrease in insertion losses into the dielectric material used to form the electronic substrates, which may be achieved with the formation of airgap structures within the dielectric material between adjacent conductive routes that transmit/receive electrical signals.

FIG. 1 illustrates an electronic substrate 110 for an integrated circuit assembly or package, according to one embodiment of the present description. The electronic substrate 110 may be any appropriate structure, including, but not limited to, an interposer, a motherboard and the like. The electronic substrate 110 may comprise a base layer 120, such as a substrate core, base dielectric layer, a semiconducting material, or the like, and at least one dielectric material layer (shown as layers 122, 124, 126, and 128), which may include build-up films and/or solder resist layers, formed on the base layer 120.

The electronic substrate 110 may further include conductive routes 130 or "metallization" extending within and/or through the electronic substrate 110. As will be understood to those skilled in the art, the conductive routes 130 may be a combination of conductive traces (shown as conductive traces 141-147) and conductive vias (shown as conductive vias 152 and 154) extending through the associated dielectric material layers (e.g. layers 122, 126, and 128) to interconnect the associated conductive traces (illustrated as conductive via 152 extending between conductive traces 141 and 142, and conductive via 154 extending between conductive traces 142 and 145). The conductive traces 141-147 and the conductive vias 152 and 154 may be made of any appropriate conductive material, including but not limited to, metals, such as copper, silver, nickel, gold, and aluminum, alloys thereof, and the like.

As further shown in FIG. 1, the electronic substrate 110 may include airgap structures 162, 164, and 166. These airgap structures 162, 164, and 166 are formed to reduce either their insertion loss, cross talk, or both. It is understood that the term "airgap" does not necessarily mean that the airgap structures 162, 164, and 166 themselves are filled with air. Rather the airgap structures 162, 164, and 166 may have any appropriate gas therein, including, but not limited to, air, nitrogen, argon, and the like. From an electrical point of view, the airgap structures 162, 164, and 166 may significantly reduce cross talk and/or insertion loss by introducing an region or several regions (i.e. the airgap structure(s)) of a low-k and low loss material (i.e. the gas within the airgap structure(s)) on one or more sides of a conductive trace (e.g. conductive traces 143, 144, 146, and 147). In one embodiment of the present description, the gas within the airgap structure may be air, which will have a dielectric capacitance (k) of about 1 and a dissipation factor (tan δ) of near 0.

It is understood that the airgap structures 162, 164, and 166 extend perpendicularly from the plane of FIG. 1 (i.e. the y-direction not shown). In one embodiment, the airgap structure 162, 164, and 166 may follow along the length of their respective conductive traces (e.g. conductive traces 143, 144, 146, and 147). Such embodiments may be particularly advantageous in serializer/de-serializer (SerDes) components to avoid fiber weave-type of effect on the high-speed differential SerDes signals, as will be understood to those skilled in the art. SerDes components are used in high speed communication to compensate for limited input/output by converting between serial date and parallel interfaces in each signaling direction.

With regard to cross-talk mitigation, the area that should be maximized between conductive traces to reduce cross-talk is essentially "voided" by the airgap structure 162, 164, and 166 that are created between the conductive traces (e.g. conductive traces 143, 144, 146, and 147). This may reduce capacitive coupling between the conductive traces (e.g. conductive traces 143, 144, 146, and 147) and, thus, may reduce cross-talk. With regard to insertion loss mitigation, the benefits of the embodiments of the present description may be two-fold. First, when a conductive trace is at least partially surrounded by the area that is essentially "lossless" (e.g. air), the overall dielectric loss will be reduced. Second, with the use of airgap structures 162, 164, and 166, the relevant conductive traces 143, 144, 146, and 147 can now be made larger (i.e. wider in the x-direction), to match the same characteristic impedance target, thus reducing ohmic losses, as will be understood to those skilled in the art. Additionally, with the embodiments of the present description, currently preferred dielectric materials can be used without the need to develop novel dielectric materials with ultra-low dielectric constant and/or dissipation factor that are compatible with current substrate manufacturing processes.

The dielectric material layer(s) 122, 124, 126, and 128 may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like. The dielectric material layers 124 and 126, in which the airgap structures 162, 164, and 166 are formed, may be dielectric materials that may be easily and precisely etched, including, but not limited to epoxy and phenol resin filled with silica fillers, and epoxy and acrylic polymer filled with silica fillers.

As shown in FIG. 1, the airgap structures 162, 164, and 166 may be positioned vertically (z-direction), horizontal (x-direction), and any appropriate position relative to the conductive traces 143, 144, 146, and 147. For example, as illustrated in FIG. 1, the airgap structure 162 may be positioned horizontally (x-direction) between conductive traces 143 and 144, the airgap structure 164 may be position vertically (z-direction) between conductive traces 143 and 146, and the airgap structure 166 may be position vertically (z-direction) between conductive traces 144 and 147.

Figure 2:
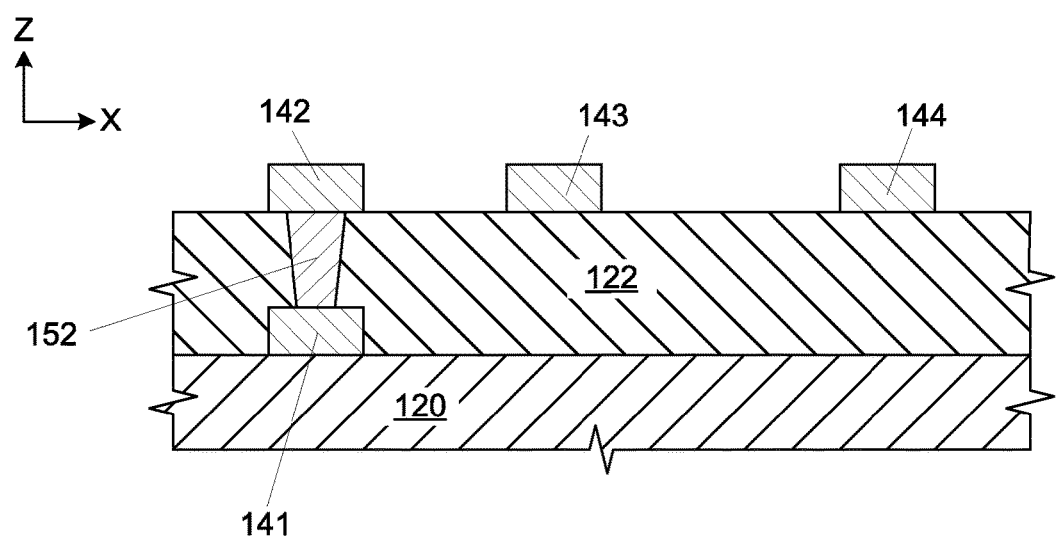
FIGS. 2-11 are side cross-sectional views of a process for the fabrication of the electronic substrate of FIG. 1, according to one embodiment of the present description.

FIGS. 2-11 illustrate a process for fabricating the electronic substrate of FIG. 1, according to an embodiment of the present description. As shown in FIG. 2, at least one conductive trace (shown as a first conductive trace 141) may be formed on a base substrate 120 and a first dielectric material layer 122 may be formed on the first conductive trace 141 and the base substrate 120. At least one conductive trace (shown as a second conductive trace 142, a third conductive trace 143, and a fourth conductive trace 144) may be formed on the first dielectric material layer 122. At least one conductive via (shown as conductive via 152) may be formed to extend through at least a portion of the first dielectric material layer 122 to connect at least one conductive trace on base substrate 120 (shown as first conductive trace 141) with at least one conductive trace on the first dielectric material layer 122 (shown as second conductive trace 142). The processes and structures for the formation of the first dielectric material layer 122, the conductive traces 141-144, and the conductive vias 152 and 154 are well known in the art and, for the purposes of clarity and conciseness, will not be illustrated or discussed herein.

Figure 3:
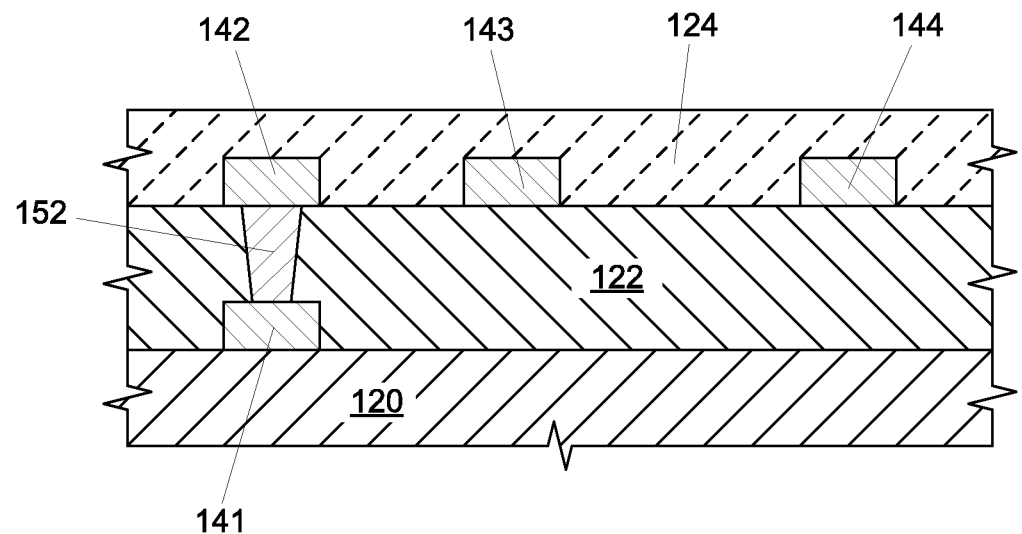
Figure 4:
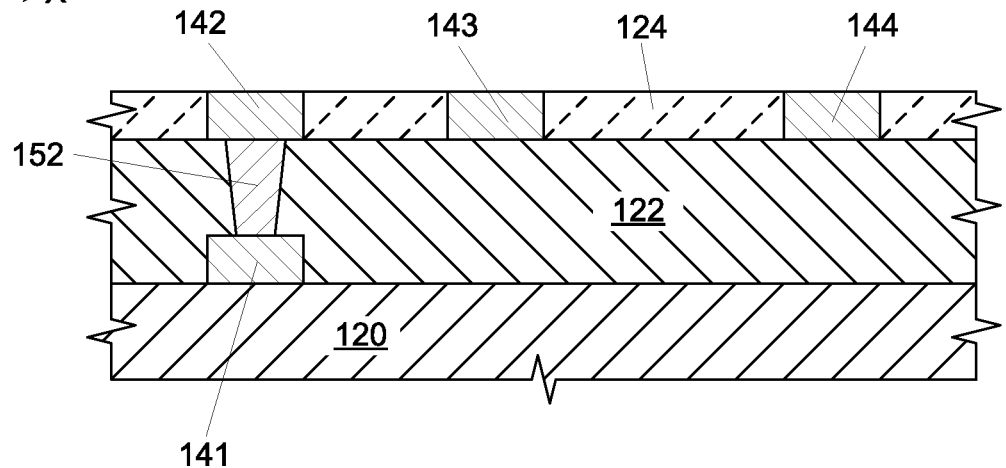
Figure 5:
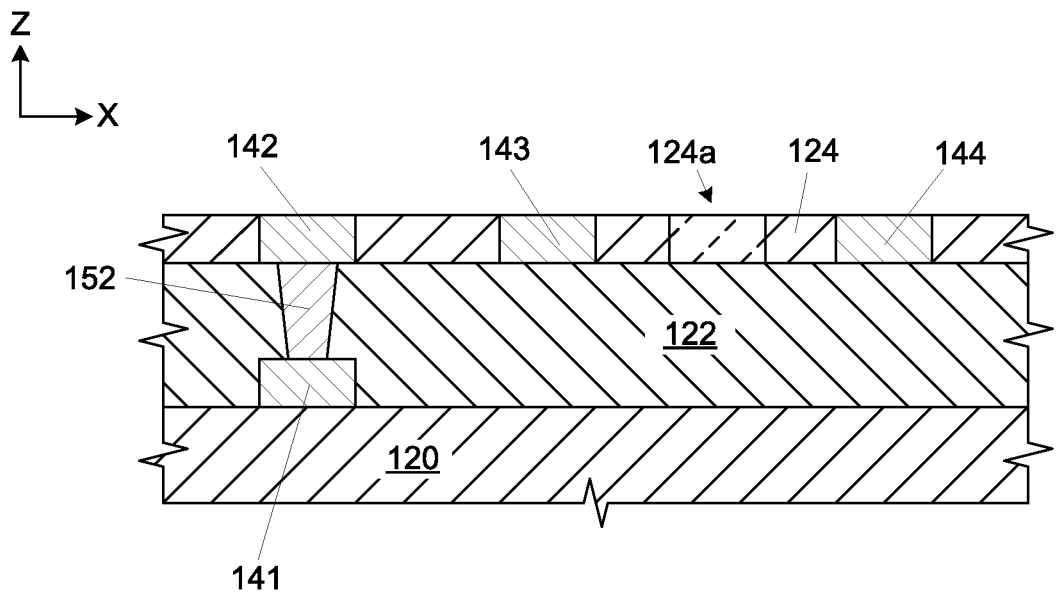
Figure 6:
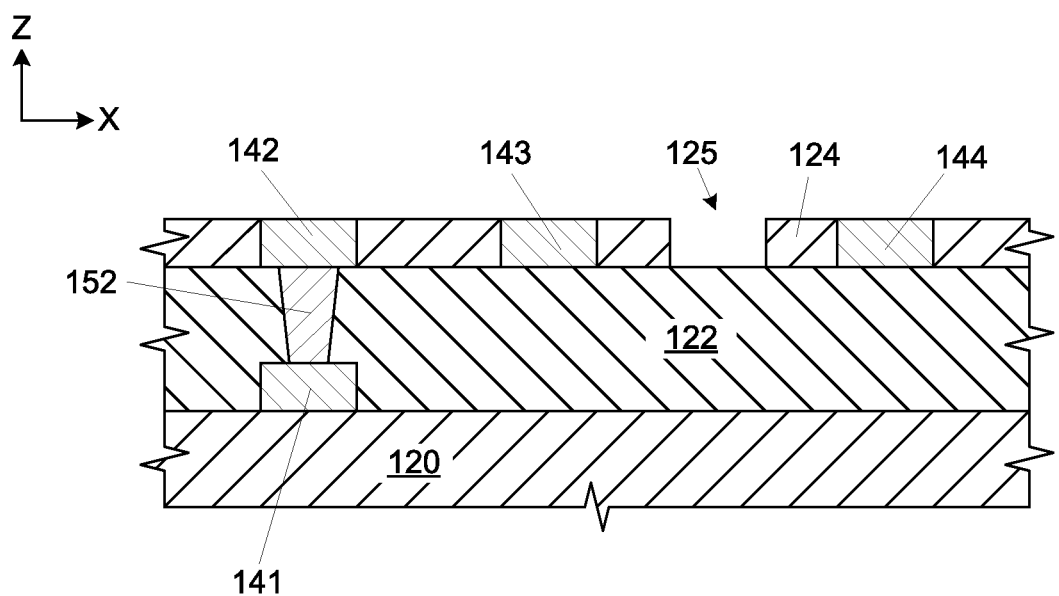

As shown in FIG. 3, an uncured or partially cured second dielectric material layer 124 may be formed on the first dielectric material layer 122. As shown in FIG. 4, the second dielectric material layer 124 may be planarized to expose at least one conductive trace (shown as a second conductive trace 142, a third conductive trace 143, and a fourth conductive trace 144) formed on the first dielectric material layer 122. As shown in FIG. 5, a portion of the second dielectric material layer 124 may be cured to leave at least one uncured or partially cured area 124a. At least a portion of the uncured area 124a (see FIG. 5) of the second dielectric material layer 124 may be removed to form an opening 125 in the second dielectric material layer 124, as shown in FIG. 6.

Figure 7:
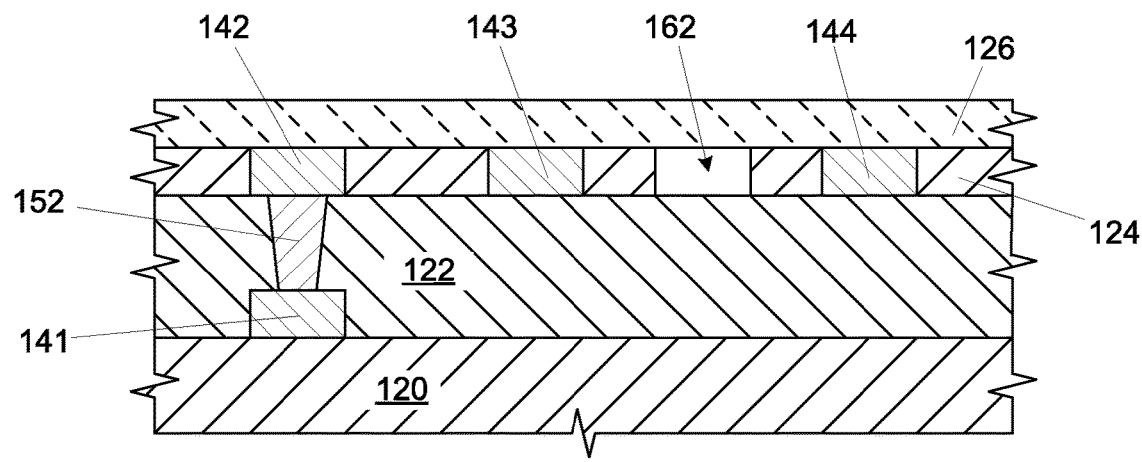
Figure 8:
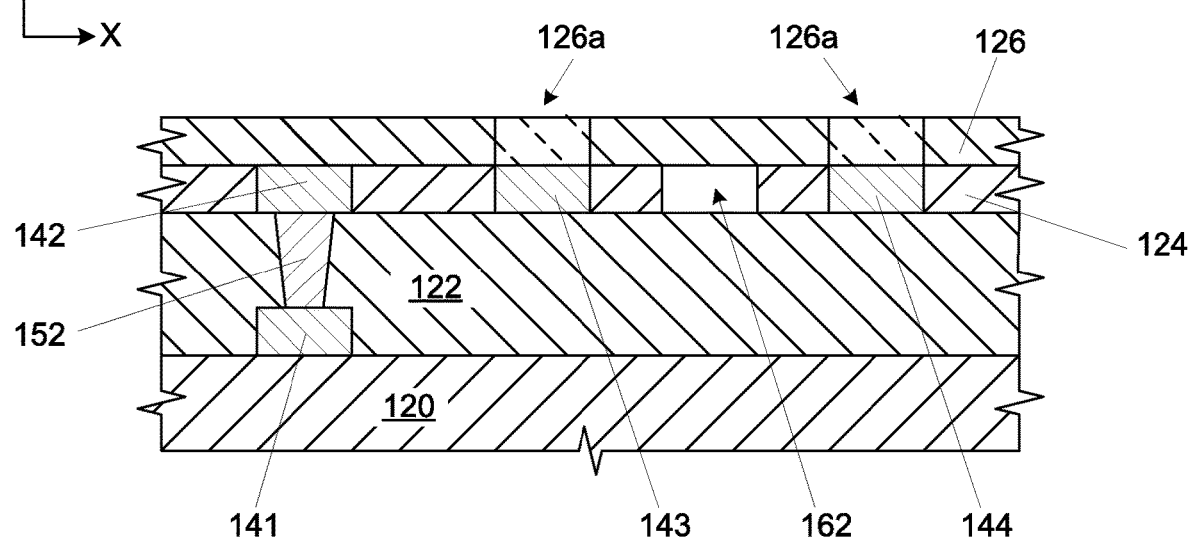
Figure 9:
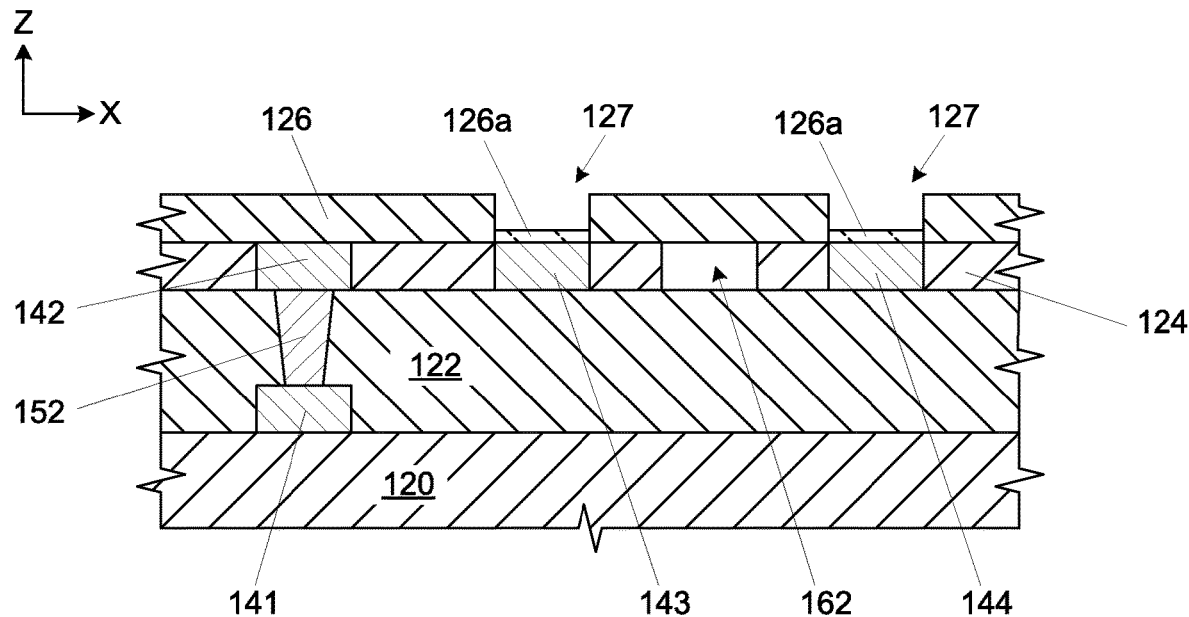
Figure 10:
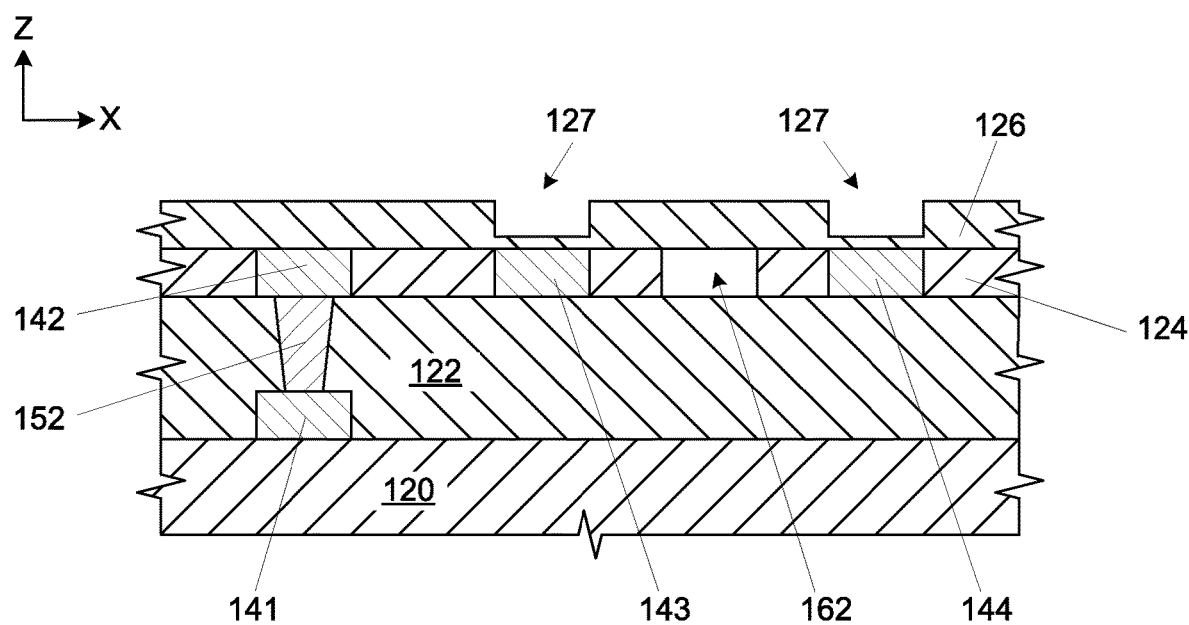

As shown in FIG. 7, an uncured or partially cured third dielectric material layer 126 may be formed on the second dielectric material layer 124 to form the airgap structure 162. As shown in FIG. 8, a portion of the third dielectric material layer 126 may be cured to leave at least one uncured or partially cured area 126a. At least a portion of the uncured area 126a of the third dielectric material layer 126 may be removed to form at least one opening 127 in the third dielectric material layer 126, as shown in FIG. 9. Any remaining portion of the uncured or partially cured area 126a may be cured, as shown in FIG. 10. It is noted that when the openings 127 are positioned such that a portion of the conductive traces 143, 144 might be exposed if the openings 127 extend entirely through the third dielectric material layer 126, then a portion of the third dielectric material layer 126 may left between the openings 127 and the conductive traces 143, 144, as shown in FIGS. 9 and 10. This may be done in order to prevent any contamination of the conductive traces 143, 144 may gases within the subsequently formed airgap. For example, oxygen within air in an airgap may oxidize a copper conductive trace.

In a specific embodiment of the fabrication steps shown in FIGS. 3-10, the second dielectric material layer 124 and the third dielectric material layer 126 may comprise an acrylic acid group and/or a phenol group, which may be etch with sodium carbonate or stronger base with pH buffer (to tune the pH) and additives to control diffusion, and the etch tools may be designed to control a uniform temperature to achieve precise thickness removal.

Figure 11:
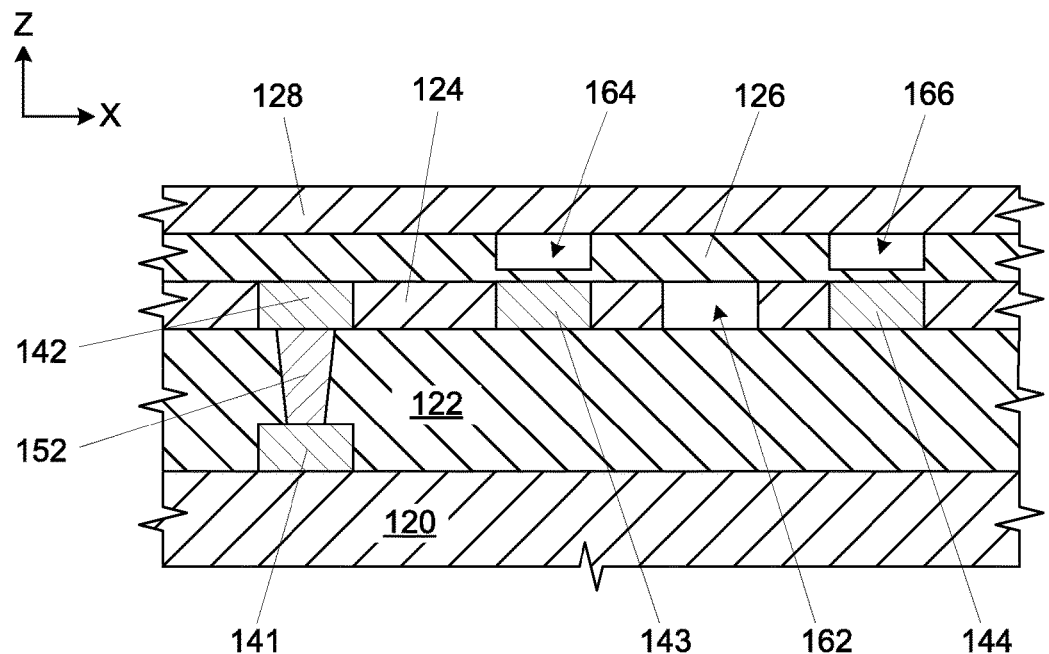

As shown in FIG. 11, the fourth dielectric material layer 128 may be formed on the third dielectric material layer 126 to form the airgap structures 164 and 166. Referring back to FIG. 1, at least one conductive trace (shown as a fifth conductive trace 145, a sixth conductive trace 146, and a seventh conductive trace 147) may be formed on the third dielectric material layer 126. At least one conductive via (shown as conductive via 154) may be formed to extend through at least a portion of the second dielectric material layer 124 and third dielectric material layer 126 to connect at least one conductive trace on fourth dielectric material layer 128 (shown as fifth conductive trace 145) with at least one conductive trace in the second dielectric material layer 124 (shown as second conductive trace 142).

Figure 12:
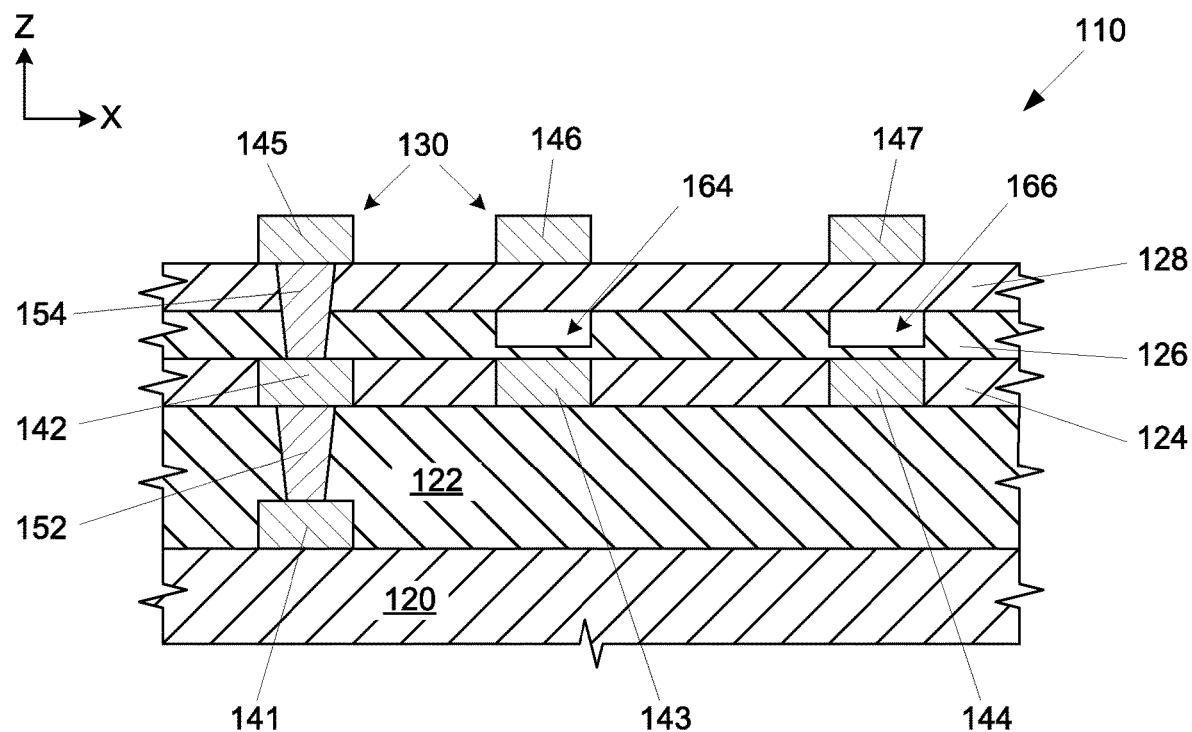
FIG. 12 is a side cross-sectional view of an electronic substrate, according to another embodiment of the present description.
Figure 13:
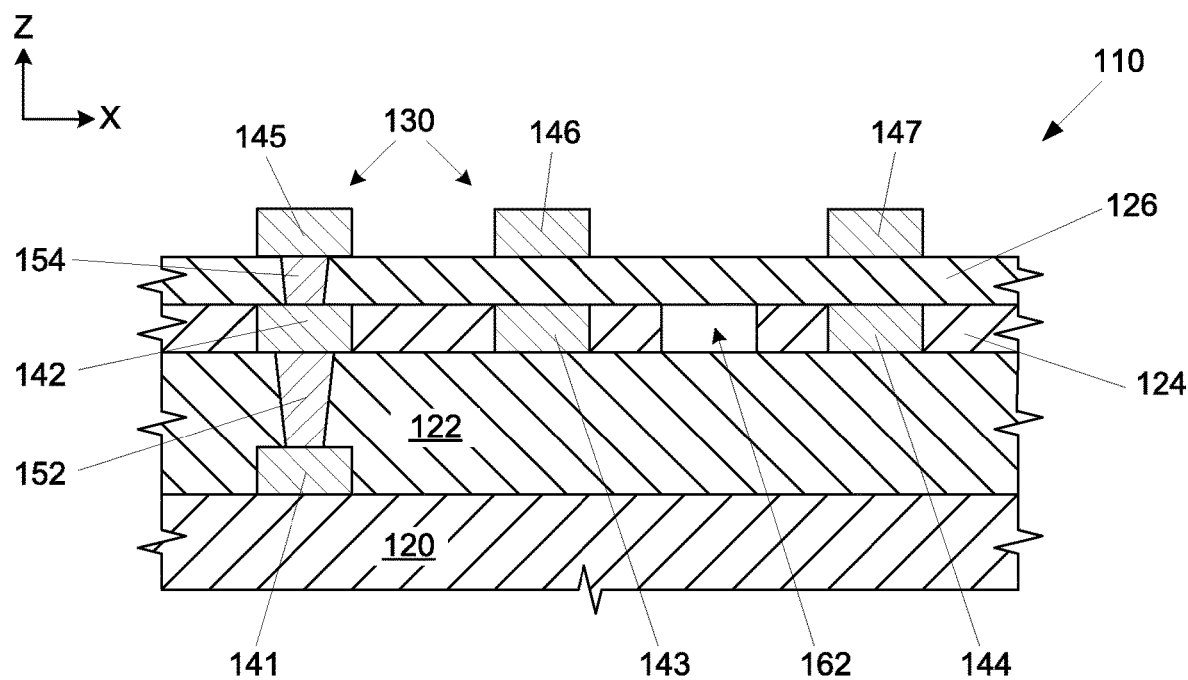
FIG. 13 is a side cross-sectional view of an electronic substrate, according to still another embodiment of the present description.

It is understood that although the airgap structures 162, 164, and 166 of the embodiments illustrated in FIGS. 1-11 are orient in both the horizontal direction (x-direction) and the vertical direction (z-direction), electronic substrate 110 may only have the airgap structures 164, 166 in the vertical direction (z-direction), as shown in FIG. 12 or may only have the airgap structure 162 in the horizontal direction (x-direction), as shown in FIG. 13. It is further understood that the airgap structure may be in any orientation and not just in the horizontal and vertical orientations illustrated.

Figure 14:
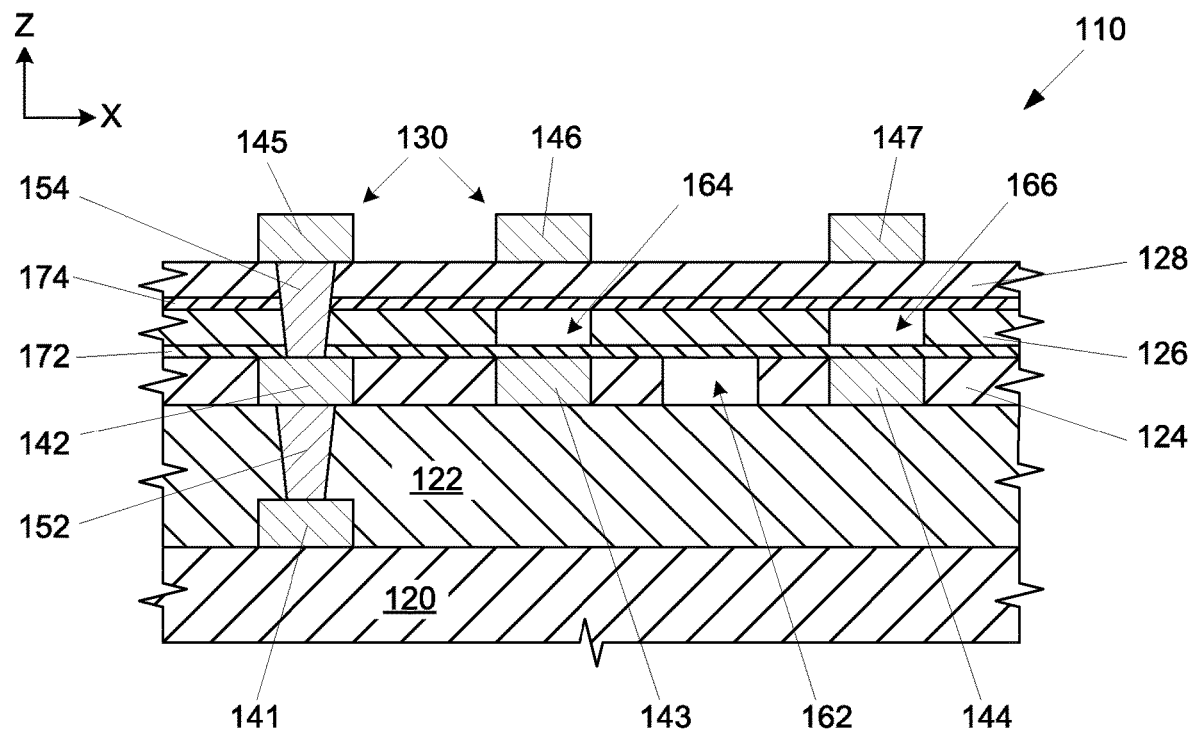
FIG. 14 is a side cross-sectional view of a portion of an electronic substrate, according to another embodiment of the present description.
Figure 15:
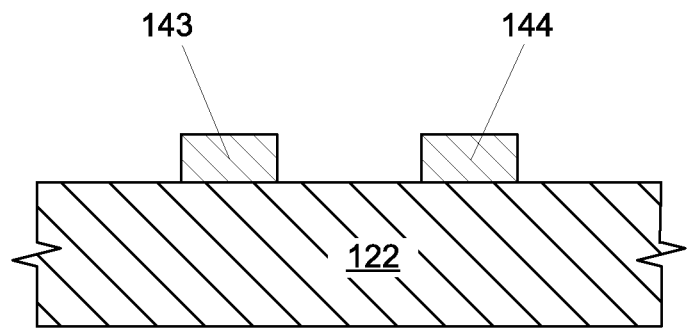
FIGS. 15-20 are side cross-sectional views of a process for the fabrication of the electronic substrate, according to one embodiment of the present description.

If there is a risk of the dielectric material layer(s) filling the airgap structures 162, 164, and 166, stiff dielectric liners can be utilized. As shown in FIG. 14, a first dielectric liner 172 may be formed over the airgap structure 162 (e.g. between the second dielectric material layer 124 and the third dielectric material layer 126) and a second dielectric liner 174 may be formed over the airgap structures 164 and 166 (e.g. between the third dielectric material layer 126 and the fourth dielectric material layer 128). The first dielectric liner 172 and the second dielectric liner 174 may be any appropriate, relatively stiff, dielectric material, as known in the art.

Figure 16:
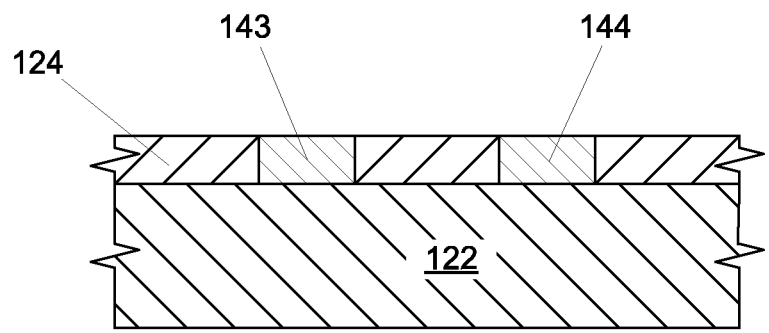
Figure 17:
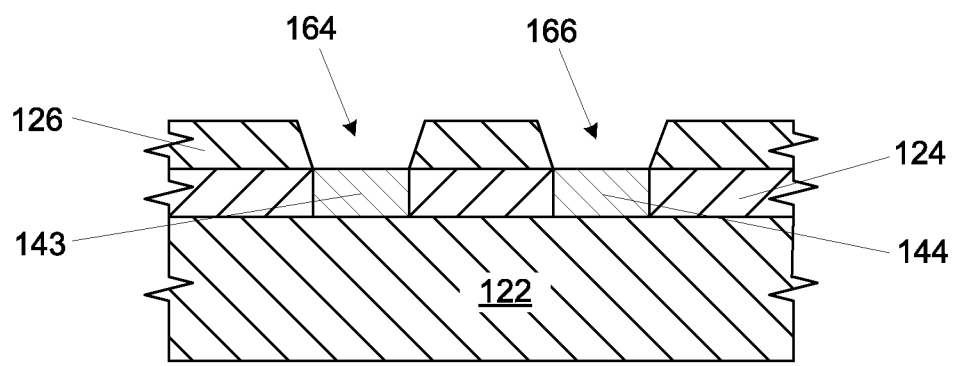
Figure 18:
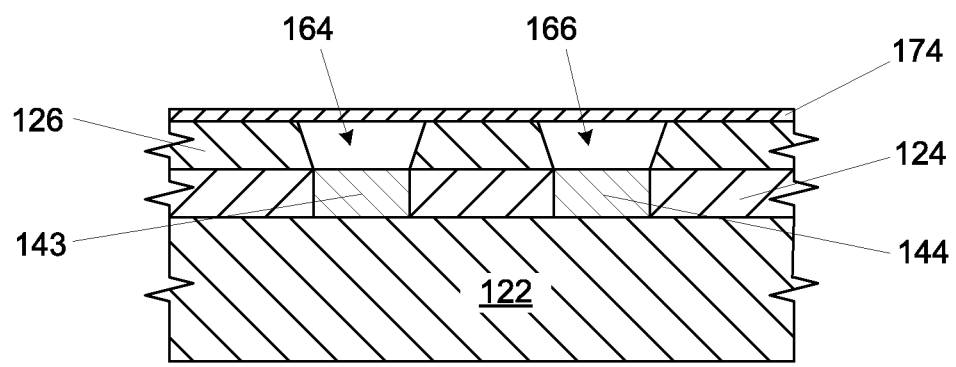
Figure 19:
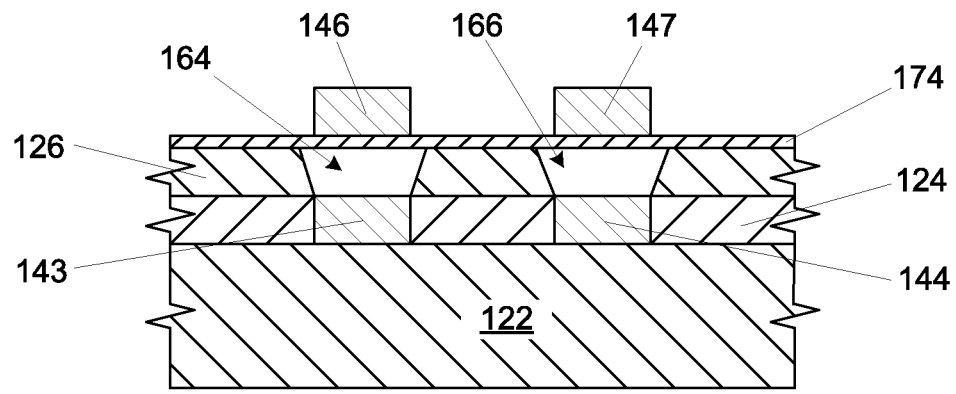
Figure 20:
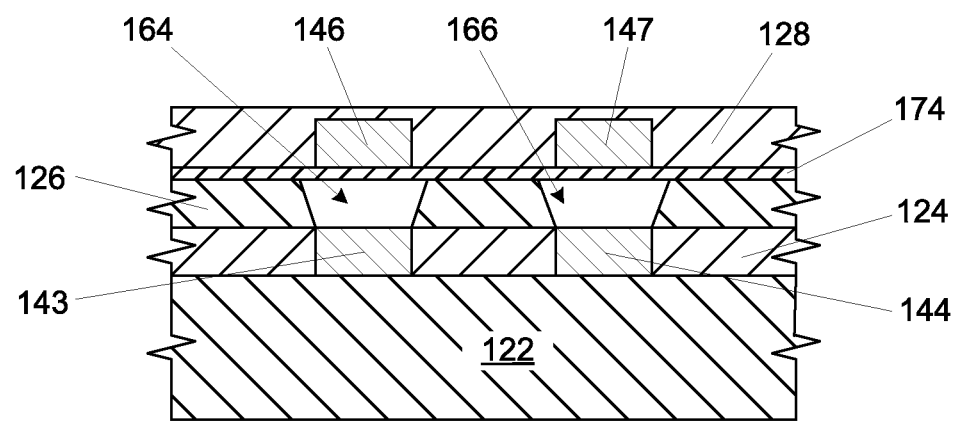
Figure 21:
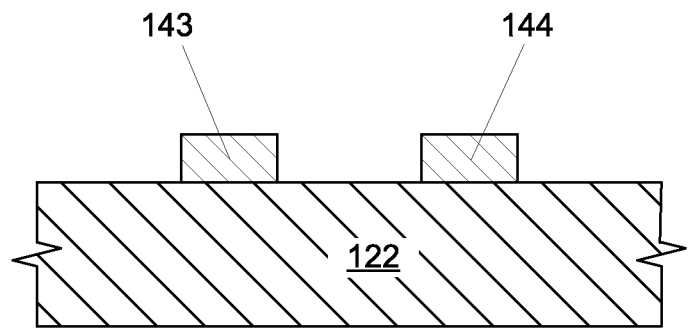
FIGS. 21-26 are side cross-sectional views of a process for the fabrication of the electronic substrate, according to another embodiment of the present description.

Although the airgap structures 162, 164, and 166 of the embodiments illustrated in FIGS. 2-11 are fabricated with an etching technique, the embodiments of the present description are not so limited. As shown in FIGS. 15-20, laser drilling techniques may be utilized to form the airgap structures 162, 164, and 166. Beginning with FIG. 15, the conductive traces 143 and 144 may be formed on the first dielectric material layer 122 by any process known in the art. The second dielectric material layer 124 may be formed on the first dielectric material layer 122 and the conductive traces 143 and 144, such as by lamination or deposition, as shown in FIG. 16. As shown in FIG. 17, a laser drilling or ablation process, as known in the art, may be use to form the openings 127, wherein the conductive traces 143 and 144 act as a laser stop. Thus, at least a portion of the conductive traces 143 and 144 may be exposed in the openings 127. As shown in FIG. 18, the dielectric liner 174 maybe be formed on second dielectric material layer 124, such as by lamination or hot press, to from the airgap structure 164 and 166. As shown in FIG. 19, conductive traces 146 and 147 may be formed on the dielectric liner 174, such as by any known lithographic process. The third dielectric material layer 126 may be formed over the second dielectric material layer 124 and the conductive traces 146 and 147, such as by lamination or deposition.

Figure 22:
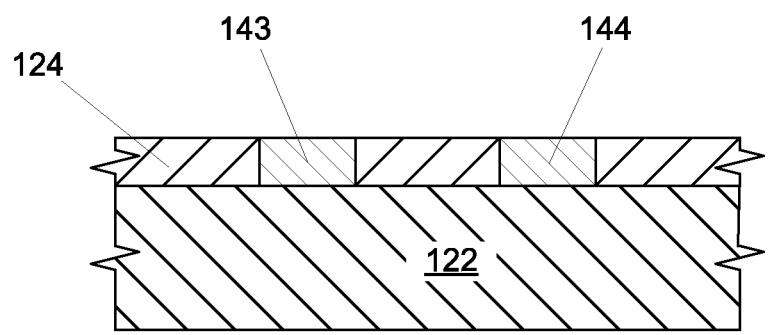
Figure 23:
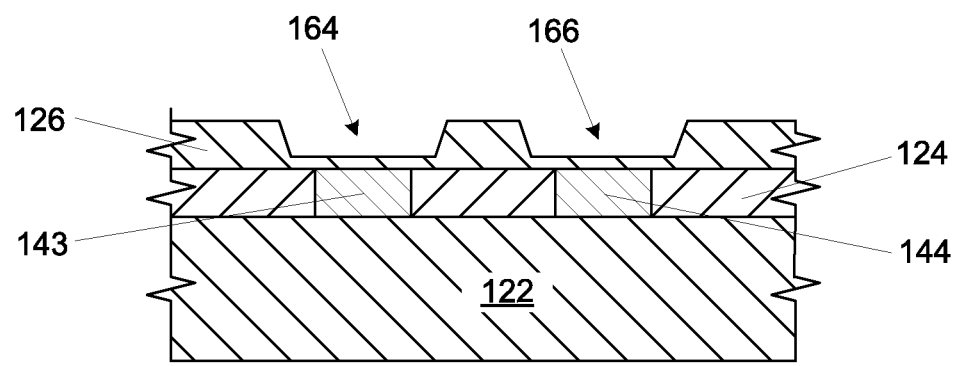
Figure 24:
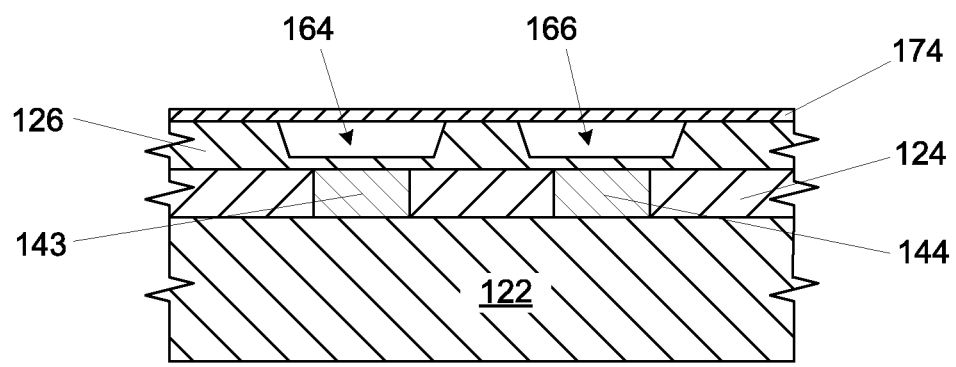
Figure 25:
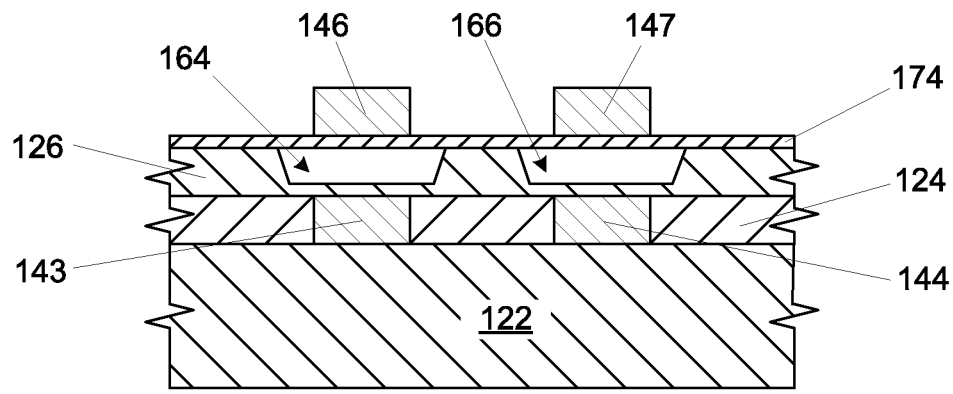
Figure 26:
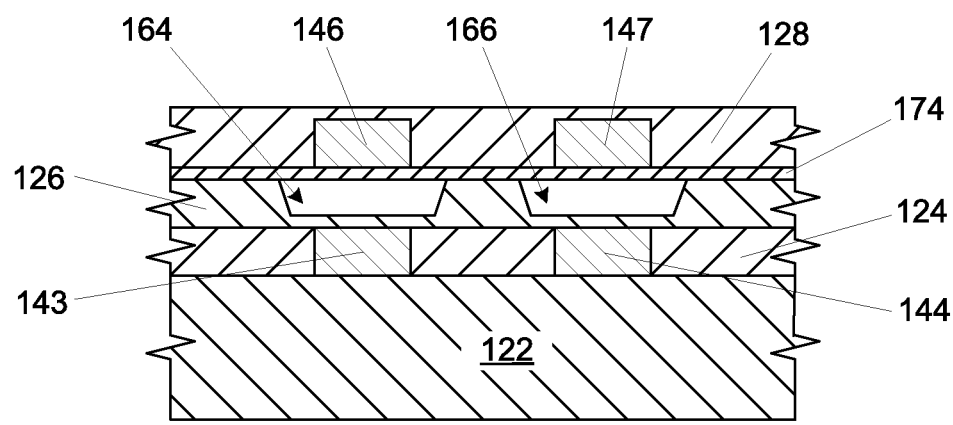

In FIGS. 21-26 illustrate an alternative process of fabricating airgap structures utilizing laser drilling techniques. Beginning with FIG. 21, the conductive traces 143 and 144 may be formed on the first dielectric material layer 122 by any process known in the art. The second dielectric material layer 124 may be formed on the first dielectric material layer 122 and the conductive traces 143 and 144, such as by lamination or deposition, as shown in FIG. 22. As shown in FIG. 23, a laser drilling or ablation process, as known in the art, may be use to form the openings 127 as shallow cavities, such that a portion of the second dielectric material layer 124 remains between the conductive traces 143 and 144, and the openings 127. As shown in FIG. 24, the dielectric liner 174 maybe be formed on second dielectric material layer 124, such as by lamination or hot press, to from the airgap structure 164 and 166. As shown in FIG. 25, conductive traces 146 and 147 may be formed on the dielectric liner 174, such as by any known lithographic process. The third dielectric material layer 126 may be formed over the second dielectric material layer 124 and the conductive traces 146 and 147, such as by lamination or deposition, as shown in FIG. 26.

It is understood that although the etching and laser drilling techniques have been illustrated and described, any appropriate know method, such as the use of sacrificial material, may be used to from the airgap structures 162, 164, and 166. The use of sacrificial material to from voids is well known in the art, and, for the purposes of clarity and conciseness, will not be described herein.

Figure 27:
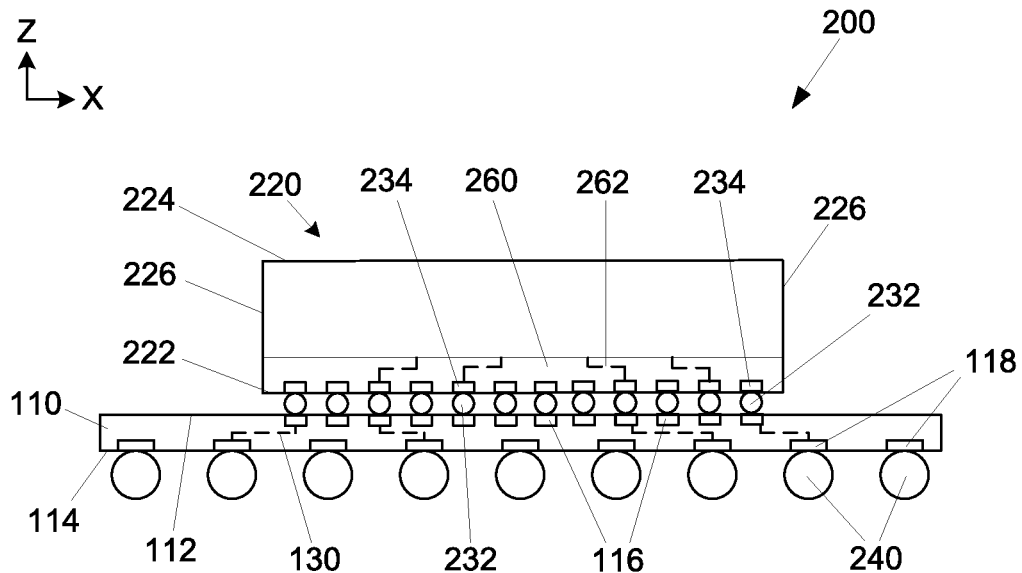
FIG. 27 is a side cross-sectional view of an integrated circuit package attached to a motherboard, according to an embodiment of the present description.

FIG. 27 illustrates an integrated circuit package 200 having at least one integrated circuit device 220 electrically attached to an electronic substrate 110 in a configuration generally known as a flip-chip or controlled collapse chip connection ("C4") configuration, according to an embodiment of the present description.

The electronic substrate 110 may be any appropriate structure, including, but not limited to, an interposer. The electronic substrate 110 may have a first surface 112 and an opposing second surface 114. The electronic substrate 110 may comprise a plurality of dielectric material layers (FIG. 1), which may include at least one airgap, such as airgaps 162, 164, and 166 discussed and illustrated with regard to FIG. 1-26.

The electronic substrate 110 may further include the conductive routes 130 or "metallization" (shown in dashed lines) extending through the electronic substrate 110. As previously discussed, the conductive routes 130 may be a combination of conductive traces (not shown) and conductive vias (not shown) extending through the plurality of dielectric material layers (not shown).

The integrated circuit device 220 may be any appropriate device, including, but not limited to, a microprocessor, a chipset, a graphics device, a wireless device, a memory device, an application specific integrated circuit, a transceiver device, an input/output device, combinations thereof, stacks thereof, or the like. As shown in FIG. 14, the integrated circuit device 220 may have a first surface 222, an opposing second surface 224, and at least one side 226 extending between the first surface 222 and the second surface 224. The integrated circuit device 220 may be a monolithic silicon die or plurality of molded composited dice.

The integrated circuit device 220 may include an interconnection layer 260 at the first surface 222 thereof. The interconnection layer 260 may comprise a plurality of dielectric material layers (not shown) conductive routes 262 or "metallization" (shown in dashed lines) extending through the interconnection layer 260. As will be understood to those skilled in the art, the conductive routes 262 may be a combination of conductive traces (not shown) and conductive vias (not shown) extending through the plurality of dielectric material layers (not shown).

In an embodiment of the present description, the first integrated circuit device 220 may be electrically attached to the electronic substrate 210 with a plurality of device-to-substrate interconnects 232. In one embodiment of the present description, the device-to-substrate interconnects 232 may extend between bond pads 116 on the first surface 112 of the electronic substrate 110 and bond pads 234 on the first surface 222 of the integrated circuit device 220. The device-to-substrate interconnects 232 may be any appropriate electrically conductive material or structure, including, but not limited to, solder balls, metal bumps or pillars, metal filled epoxies, or a combination thereof. In one embodiment, the device-to-substrate interconnects 232 may be solder balls formed from tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). In another embodiment, the device-to-substrate interconnects 232 may be copper bumps or pillars. In a further embodiment, the device-to-substrate interconnects 232 may be metal bumps or pillars coated with a solder material.

The bond pads 234 may be in electrical contact with the conductive routes 262, which may, in turn, be in electrical communication with integrated circuitry (not shown) within the integrated circuit device 220. The bond pads 116 on the first surface 112 of the electronic substrate 110 may be in electrical contact with the conductive routes 130. The conductive routes 130 may extend through the electronic substrate 110 and be connected to bond pads 118 on the second surface 114 of the electronic substrate 110. As will be understood to those skilled in the art, the electronic substrate 110 may reroute a fine pitch (center-to-center distance between the bond pads) of the integrated circuit device bond pads 116 to a relatively wider pitch of the bond pads 118 on the second surface 114 of the electronic substrate 110. In one embodiment of the present description, external interconnects 240 may be disposed on the bond pads 118 on the second surface 114 of the electronic substrate 110. The external interconnects 240 may be any appropriate electrically conductive material, including, but not limited to, metal filled epoxies and solders, such as tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). The external interconnects 240 may be used to attach the integrated circuit assembly 200 to an external substrate (not shown), such as a motherboard.

Figure 28:
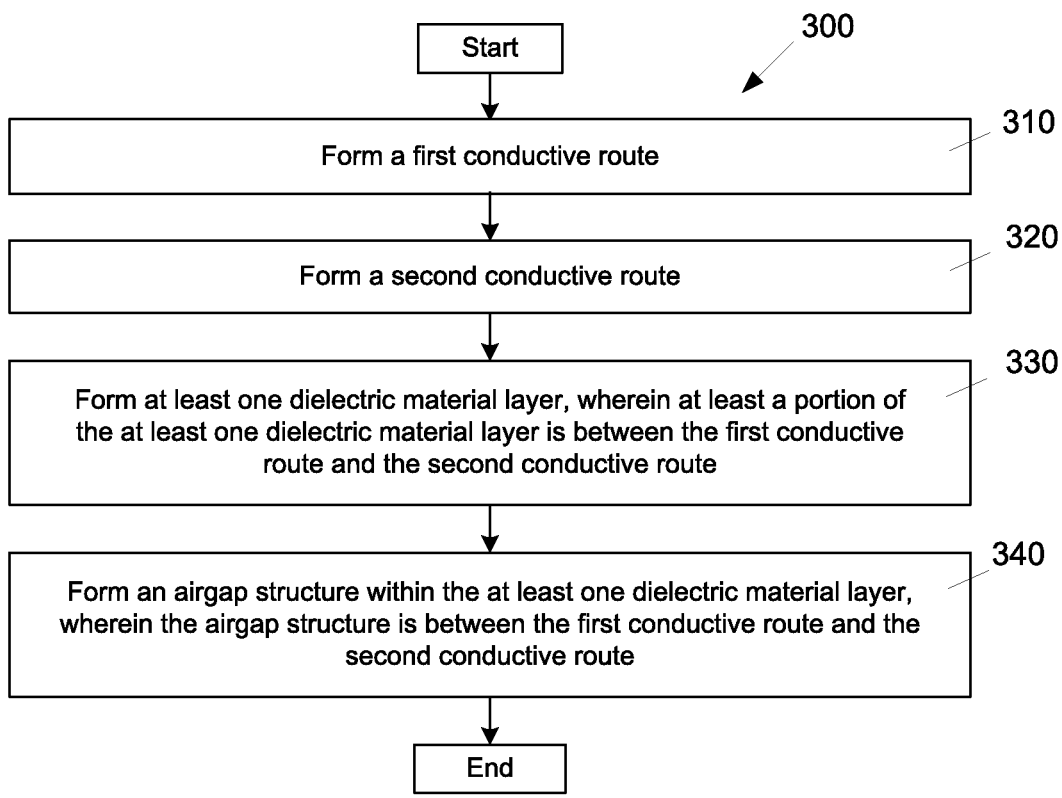
FIG. 28 is a flow chart of a process of fabricating an electronic substrate, according to an embodiment of the present description.

FIG. 28 is a flow chart of a process 300 of fabricating an electronic substrate according to an embodiment of the present description. As set forth in block 310, a first conductive route may be formed. A second conductive route may be formed, as set forth in block 320. As set forth in block 330, at least one dielectric material layer may be formed, wherein at least a portion of the at least one dielectric material layer is between the first conductive route and the second conductive route. An airgap structure may be formed within the at least one dielectric material layer, wherein the airgap structure is between the first conductive route and the second conductive route, as set forth in block 340.

Figure 29:
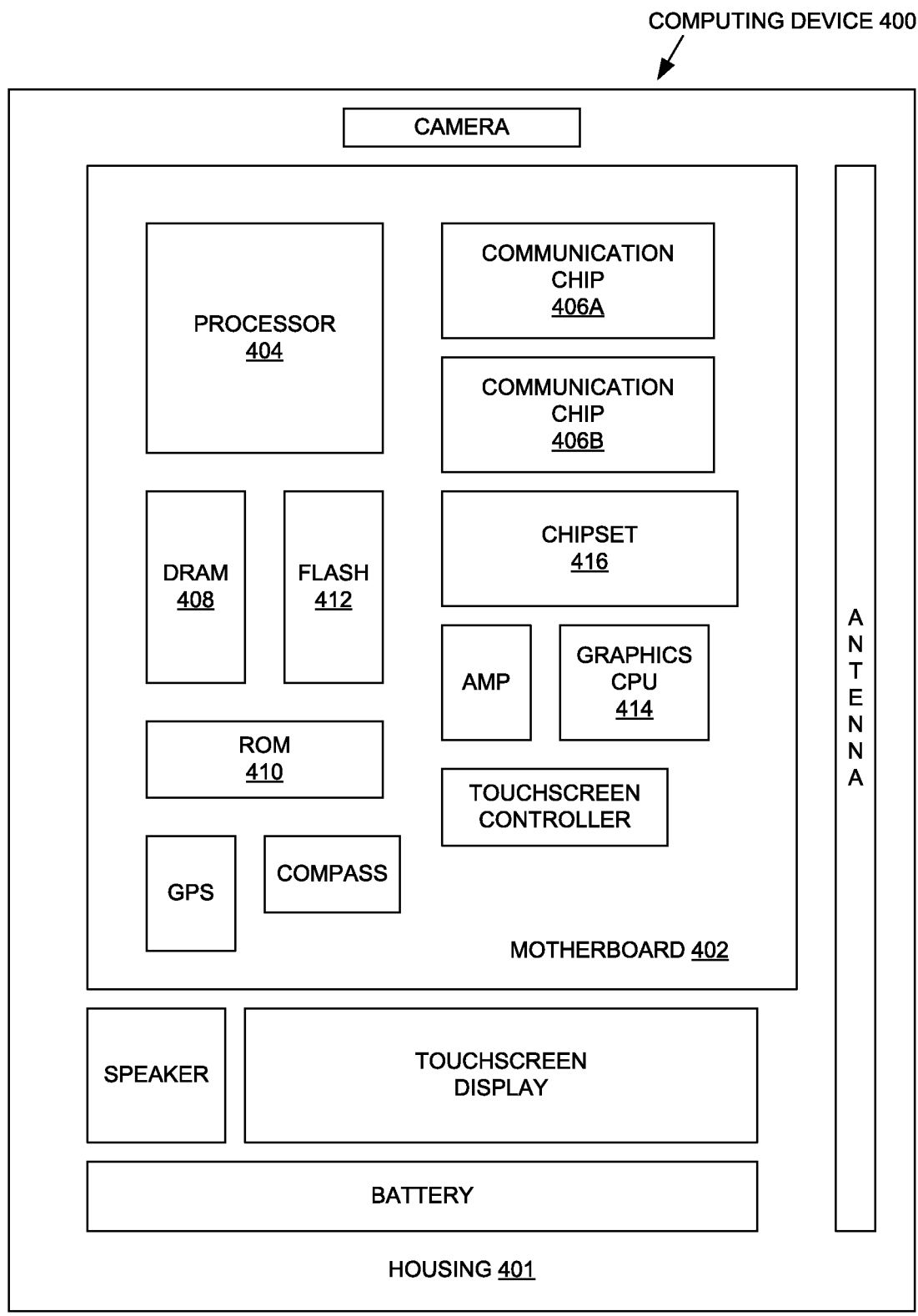
FIG. 29 is an electronic system, according to one embodiment of the present description.

FIG. 29 illustrates an electronic or computing device 400 in accordance with one implementation of the present description. The computing device 400 may include a housing 401 having a board 402 disposed therein. The computing device 400 may include a number of integrated circuit components, including but not limited to a processor 404, at least one communication chip 406A, 406B, volatile memory 408 (e.g., DRAM), non-volatile memory 410 (e.g., ROM), flash memory 412, a graphics processor or CPU 414, a digital signal processor (not shown), a crypto processor (not shown), a chipset 416, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 402. In some implementations, at least one of the integrated circuit components may be a part of the processor 404.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an electronic substrate, comprising a first conductive route, a second conductive route, at least one dielectric material layer, wherein at least a portion of the at least one dielectric material layer is between the first conductive route and the second conductive route, and an airgap structure within the at least one dielectric material layer, wherein the airgap structure is between the first conductive route and the second conductive route.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-29. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein Example 1 is an electronic substrate, comprising a first conductive route; a second conductive route; at least one dielectric material layer, wherein at least a portion of the at least one dielectric material layer is between the first conductive route and the second conductive route; and an airgap structure within the at least one dielectric material layer, wherein the airgap structure is between the first conductive route and the second conductive route.

In Example 2, the subject matter of Example 1 can optionally include the first conductive route being horizontally oriented to the second conductive route.

In Example 3, the subject matter of Example 1 can optionally include the first conductive route being vertically oriented to the second conductive route.

In Example 4, the subject matter of any of Examples 1 to 3 can optionally include at least a portion of at least one of the first conductive route and the second conductive route being exposed in the airgap structure.

In Example 5, the subject matter of any of Examples 1 to 4 can optionally include the at least one dielectric material is selected from the group consisting of epoxy and phenol resin filled with silica fillers, and epoxy and acrylic polymer filled with silica fillers.

Example 6 is an integrated circuit package comprising an integrated circuit device; and an electronic substrate electrically attached to the integrated circuit device, wherein the electronic substrate comprises a first conductive route, a second conductive route, a portion of at least one dielectric material layer between the first conductive route and the second conductive route, and an airgap structure within the at least one dielectric material layer, wherein the airgap structure is between the first conductive route and the second conductive route.

In Example 7, the subject matter of Example 6 can optionally include the first conductive route being horizontally oriented to the second conductive route.

In Example 8, the subject matter of Example 6 can optionally include the first conductive route being vertically oriented to the second conductive route.

In Example 9, the subject matter of any of Examples 6 to 8 can optionally include at least a portion of at least one of the first conductive route and the second conductive route being exposed in the airgap structure.

In Example 10, the subject matter of any of Examples 6 to 9 can optionally include the at least one dielectric material is selected from the group consisting of epoxy and phenol resin filled with silica fillers, and epoxy and acrylic polymer filled with silica fillers.

Example 11 is an electronic system, comprising an electronic board and an integrated circuit assembly electrically attached to the electronic board, wherein at least one of the integrated circuit assembly and the electronic board, includes a first conductive route; a second conductive route; at least one dielectric material layer, wherein at least a portion of the at least one dielectric material layer is between the first conductive route and the second conductive route; and an airgap structure within the at least one dielectric material layer, wherein the airgap structure is between the first conductive route and the second conductive route.

In Example 12, the subject matter of Example 11 can optionally include the first conductive route being horizontally oriented to the second conductive route.

In Example 13, the subject matter of Example 11 can optionally include the first conductive route being vertically oriented to the second conductive route.

In Example 14, the subject matter of any of Examples 11 to 13 can optionally include at least a portion of at least one of the first conductive route and the second conductive route being exposed in the airgap structure.

In Example 15, the subject matter of any of Examples 11 to 14 can optionally include the at least one dielectric material is selected from the group consisting of epoxy and phenol resin filled with silica fillers, and epoxy and acrylic polymer filled with silica fillers.

Example 16 is a method of forming an electronic substrate, comprising forming a first conductive route; forming a second conductive route; forming at least one dielectric material layer, wherein at least a portion of the at least one dielectric material layer is between the first conductive route and the second conductive route; and forming an airgap structure within the at least one dielectric material layer, wherein the airgap structure is between the first conductive route and the second conductive route.

In Example 17, the subject matter of Example 16 can optionally include forming the second conductive route comprising horizontally orienting the second conductive route to the first conductive route.

In Example 18, the subject matter of Example 16 can optionally include forming the second conductive route comprises vertically orienting the second conductive route to the first conductive route.

In Example 19, the subject matter of any of Examples 16 to 18 can optionally include forming the airgap structure comprising exposing at least a portion of one of the first conductive route and the second conductive route.

In Example 20, the subject matter of any of Examples 16 to 19 can optionally include forming the at least one dielectric material comprises forming the at least one dielectric material from a material is selected from the group consisting of epoxy and phenol resin filled with silica fillers, and epoxy and acrylic polymer filled with silica fillers.

In Example 21, the subject matter of Example 16 can optionally include forming the airgap structure with the at least one dielectric material layer comprising laser drilling an opening within the at least one dielectric material layer.

In Example 22, the subject matter of Example 16 can optionally include forming the airgap structure with the at least one dielectric material layer comprising etching an opening within the at least one dielectric material layer.

In Example 23, the subject matter of Example 16 can optionally include forming at least one dielectric material layer comprising forming an uncured or partially cured dielectric material layer and curing a portion of the at least one dielectric material layer to leave at least one uncured or partially cured area, and wherein forming the airgap comprises removing at least a portion of the uncured or partially cured area.

In Example 24, the subject matter of Example 23 can optionally include curing any remaining portion of the uncured or partially cured area.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An integrated circuit die package substrate, comprising:
a first conductive via within a dielectric build-up film;
a metallization routing layer over, and in contact with, the first conductive via, where the metallization routing layer comprises a first conductive route coplanar with a second conductive route, wherein the first and second conductive routes extend over the build-up film;
a first dielectric material layer in contact with the dielectric build-up film and comprising an epoxy and phenol resin with silica fillers or an epoxy and acrylic polymer with silica fillers, wherein at least a portion of the first dielectric material layer is between the first conductive route and the second conductive route and a top surface of the first dielectric material layer is coplanar with a top surface of the first and second conductive routes;
an airgap structure within the first dielectric material layer, wherein the airgap structure is between the first conductive route and the second conductive route and wherein the airgap structure has substantially a same height as the first conductive route and the second conductive route; and
a second dielectric material layer in contact with the first dielectric material layer, enclosing the airgap structure, and in contact with the top surface of the first and second conductive routes.

2. The integrated circuit die package substrate of claim 1, wherein the airgap structure is laterally spaced apart from both the first conductive route and the second conductive route by a portion of the first dielectric material layer.

3. The integrated circuit die package substrate of claim 1, wherein the second dielectric material layer comprises an epoxy and phenol resin with silica fillers or an epoxy and acrylic polymer with silica fillers, and further comprising a second airgap structure within the second dielectric material layer and over the first conductive route, wherein the second airgap structure has substantially the same width as the first conductive route.

4. The integrated circuit die package substrate of claim 3, wherein the second dielectric material layer is substantially coplanar with a top surface of the second airgap structure and wherein a partial thickness of the second dielectric material layer is between the second airgap structure and the first conductive route.

5. The integrated circuit die package substrate of claim 4, further comprising a second via extending through the second dielectric material layer.

6. The integrated circuit die package substrate of claim 4, further comprising a third dielectric material layer over, and in contact with, the second dielectric material layer and enclosing the second airgap structure, and wherein the second via extends through the third dielectric material layer.

7. The integrated circuit die package substrate of claim 6, further comprising a second routing metallization layer over the third dielectric material layer, the second routing metallization layer comprising a third conductive route over the first conductive route within the second airgap structure between the first and third conductive routes.

8. An electronic system, comprising:
an electronic board; and
an integrated circuit assembly electrically attached to the electronic board, wherein the integrated circuit assembly includes an IC die attached to an integrated circuit die package substrate, and wherein the integrated circuit die package substrate and the electronic board includes:
a first conductive via within a dielectric build-up film;
a metallization routing layer over, and in contact with, the first conductive via, where the metallization routing layer comprises a first conductive route and a second conductive route substantially coplanar with the first conductive route;
a first dielectric material layer in contact with the dielectric build-up film and comprising an epoxy and phenol resin with silica fillers or an epoxy and acrylic polymer with silica fillers, wherein at least a portion of the first dielectric material layer is between the first conductive route and the second conductive route and a top surface of the first dielectric material layer is coplanar with a top surface of the first and second conductive routes;

a first airgap structure within the first dielectric material layer, wherein the first airgap structure is between the first conductive route and the second conductive route, and wherein the first airgap structure has substantially the same height as the first and second conductive routes;

a second dielectric material layer over the first dielectric material layer, enclosing the first airgap structure and in contact with the top surface of the first conductive route and the second conductive route, wherein the second dielectric material layer comprises an epoxy and phenol resin with silica fillers or an epoxy and acrylic polymer with silica fillers; and a second airgap structure within the second dielectric material layer, wherein the second airgap structure is over the first conductive route and has substantially the same width as the first conductive route and wherein a partial thickness of the second dielectric material is between the second airgap structure and the first conductive route.

9. The electronic system of claim 8, further comprising a third dielectric material layer over the second dielectric material layer and enclosing the second airgap structure.

10. The electronic system of claim 8, further comprising a third airgap structure within the second dielectric material layer and substantially coplanar with the second airgap structure, wherein the third airgap structure is over the second conductive route and has substantially the same width as the second conductive route.

11. The electronic system of claim 9, further comprising a second routing metallization layer over the third dielectric material layer, the second airgap structure between the first conductive route and a conductive route of the second routing metallization layer.

12. A method of forming an electronic substrate, comprising:

applying a dielectric build-up film to a base layer and forming a conductive via within the dielectric build-up film;

forming a metallization layer over the dielectric build-up film, the metallization layer comprising a first conductive route coplanar with a second conductive route;

forming a first dielectric material layer over the dielectric build-up film, wherein the first dielectric material layer comprises an epoxy and phenol resin with silica fillers or an epoxy and acrylic polymer with silica fillers, and wherein at least a portion of the first dielectric material layer is between the first conductive route and the second conductive route;

planarizing the first dielectric material layer to expose a top surface of the first and second conductive routes;

forming an opening by removing a full thickness of the first dielectric material layer within an area between the first and second conductive routes; and forming an airgap structure within the first dielectric material layer by forming a second dielectric material layer over the opening, wherein the airgap structure is between the first conductive route and the second conductive route and wherein the airgap structure has substantially a same height as the first conductive route and the second conductive route.

13. The method of claim 12, further comprising forming a second opening by removing only a partial thickness of the second dielectric material layer of the first or second conductive route.

14. The method of claim 12, wherein forming the opening within the first dielectric material layer comprises laser drilling.

15. The method of claim 12, wherein forming the opening within the first dielectric material layer comprises etching through the full thickness of the first dielectric material layer with sodium carbonate or another base stronger than sodium carbonate.

16. The method of claim 12, wherein forming the first dielectric material layer comprises forming an uncured or partially cured dielectric material layer and curing a portion of the first dielectric material layer to leave at least one uncured or partially cured area, and wherein forming the opening comprises removing at least a portion of the uncured or partially cured area.

17. The method of claim 16, further comprising curing any remaining portion of the uncured or partially cured area.

* * * * *